(12) United States Patent
Kim et al.

(10) Patent No.: US 10,431,765 B2
(45) Date of Patent: Oct. 1, 2019

(54) WHITE ORGANIC LIGHT EMITTING DIODE AND DISPLAY INCLUDING THE SAME

(71) Applicant: LG Display Co., Ltd., Seoul (KR)

(72) Inventors: Ji-Young Kim, Seongnam-si (KR); Youn-Seok Kam, Seoul (KR); Ki-Woog Song, Goyang-si (KR); Tae-Shick Kim, Yongin-si (KR); Min-Gyu Lee, Paju-si (KR); Tae-Seok Lim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 201 days.

(21) Appl. No.: 15/693,098

(22) Filed: Aug. 31, 2017

(65) Prior Publication Data

US 2018/0062103 A1    Mar. 1, 2018

(30) Foreign Application Priority Data

Aug. 31, 2016 (KR) .................. 10-2016-0111448

(51) Int. Cl.
*H01L 51/50* (2006.01)
*H01L 51/00* (2006.01)
(Continued)

(52) U.S. Cl.
CPC ...... *H01L 51/5044* (2013.01); *H01L 51/0072* (2013.01); *H01L 51/5004* (2013.01);
(Continued)

(58) Field of Classification Search
CPC ............ H01L 51/5044; H01L 51/5004; H01L 51/0072

See application file for complete search history.

(56) References Cited

U.S. PATENT DOCUMENTS

| 8,492,783 B2 | 7/2013 | Usami |
| 9,076,978 B2 * | 7/2015 | Lee ..................... H01L 51/508 |

(Continued)

FOREIGN PATENT DOCUMENTS

| CN | 1978441 A | 6/2007 |
| CN | 102160459 A | 8/2011 |

(Continued)

OTHER PUBLICATIONS

SciFinder Structure Searches, Apr. 30, 2019.*

*Primary Examiner* — Vu A Nguyen
(74) *Attorney, Agent, or Firm* — Seed IP Law Group LLP

(57) ABSTRACT

Disclosed are a tandem white organic light emitting diode with long lifespan and low driving voltage, and a display device including the same. The white organic light emitting diode includes a first light emitting part, a second light emitting part and a third light emitting part disposed between a first electrode and a second electrode. The first and third light emitting parts include a blue light emitting layer and the second light emitting part includes a red light emitting layer and a yellow-green light emitting layer. At least one layer of the red light emitting layer and the yellow-green light emitting layer includes a hole transport (Continued)

host based on a compound shown below:

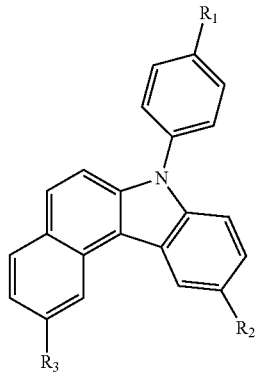

wherein each of $R_1$, $R_2$, and $R_3$ are independently selected from hydrogen, heavy hydrogen, a C5-C7 aromatic cyclic and C1-C6 heterocyclic group.

16 Claims, 6 Drawing Sheets

(51) Int. Cl.
   *H01L 51/52* (2006.01)
   *H01L 27/32* (2006.01)

(52) U.S. Cl.
   CPC ...... *H01L 51/5072* (2013.01); *H01L 27/3244* (2013.01); *H01L 51/5036* (2013.01); *H01L 51/5278* (2013.01); *H01L 2251/5384* (2013.01)

(56) References Cited

U.S. PATENT DOCUMENTS

| | | | |
|---|---|---|---|
| 10,026,915 B2 * | 7/2018 | Yoo | ............ H01L 51/5028 |
| 2006/0115680 A1 | 6/2006 | Hwang et al. | |

FOREIGN PATENT DOCUMENTS

| | | | | |
|---|---|---|---|---|
| CN | 103872253 A | | 6/2014 | |
| KR | 20110041330 A | * | 4/2011 | ............. C09K 11/06 |
| KR | 20120081539 A | * | 7/2012 | ............. C09K 11/06 |
| KR | 20130009614 A | * | 1/2013 | ........... C07D 403/04 |
| KR | 10-2014-0119990 A | | 10/2014 | |
| KR | 20140133273 A | * | 11/2014 | ........... C07D 209/82 |
| KR | 1595697 B1 | * | 2/2016 | ........... C07D 209/56 |
| WO | WO-2010021524 A2 | * | 2/2010 | ........... C07D 209/80 |
| WO | WO-2013002509 A2 | * | 1/2013 | ............. C09K 11/06 |

* cited by examiner

WHITE ORGANIC LIGHT EMITTING DIODE AND DISPLAY INCLUDING THE SAME

CROSS-REFERENCE TO RELATED APPLICATION

This application claims the benefit of Korean Patent Application No. 10-2016-0111448, filed on Aug. 31, 2016, which is hereby incorporated by reference as if fully set forth herein.

BACKGROUND

Technical Field

The present disclosure relates to an organic light emitting diode and a display device including the same. More particularly, the present disclosure relates to a white organic light emitting diode having a tandem structure to improve a lifespan of the diode and a display device including the same.

Description of the Related Art

Recently, with increasing interest in information displays and increasing demand for potable information media, a great deal of research and commercialization is focused on lightweight flat displays.

Thereamong, an organic light emitting display can exhibit excellent viewing angle and high contrast ratio by using an organic light emitting diode spontaneously emitting light. In addition, the organic light emitting display exhibits low power consumption because it does not require any light source and has high potential to realize lightweight thin displays and flexible displays.

Such an organic light emitting diode may include a hole injection layer, a hole transport layer, a light emitting layer, an electron transport layer, an electron injection layer and a second electrode stacked in this order or a reverse order on a first electrode. In this case, an electrode contacting the hole injection layer is defined as an anode and an electrode contacting the electron injection layer is defined as a cathode.

The organic light emitting display may have a structure in which a white organic light emitting diode emits white light and the white light passes through color filters, thereby being converted into red, green and blue light, thus displaying an image. Such an organic light emitting display utilizes a white organic light emitting diode having a multi stack structure including a plurality of light emitting layers.

As the characteristics of the white organic light emitting diode are improved, performance of an organic light emitting display using the same is also enhanced. Accordingly, it is considerably important to secure a white organic light emitting diode with superior properties including high luminous efficacy, long lifespan and low driving voltage in order to manufacture an organic light emitting display with low power consumption, long lifespan and high efficiency and research is actively underway to achieve this goal.

BRIEF SUMMARY

Accordingly, the present disclosure is directed to a white organic light emitting diode and a display including the same that substantially obviate one or more problems due to limitations and disadvantages of the related art.

An object of the present disclosure is to provide a tandem white organic light emitting diode with long lifespan and low driving voltage, and a display device including the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a white organic light emitting diode includes a first light emitting part disposed on a first electrode and including a first blue light emitting layer, a first charge generation layer disposed on the first light emitting part, a second light emitting part disposed on the first charge generation layer, and a second electrode disposed on the second light emitting part.

The second light emitting part may include a red light emitting layer and a yellow-green light emitting layer, wherein at least one layer of the red light emitting layer and the yellow-green light emitting layer includes a hole transport host based on a compound shown below:

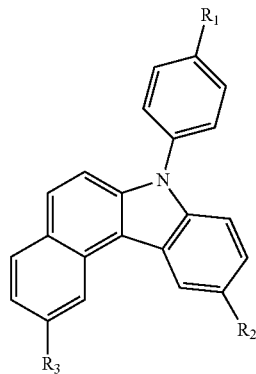

wherein each of $R_1$, $R_2$, and $R_3$ are independently selected from the group consisting of hydrogen, heavy hydrogen (i.e., isotopes of hydrogen such as deuterium and tritium), a C5-C7 aromatic cyclic and a C1-C6 heterocyclic group.

The yellow-green light emitting layer may include double layers of a first yellow-green light emitting layer and a second yellow-green light emitting layer. A proportion of the dopant of the first yellow-green light emitting layer contacting the red light emitting layer may be higher than that of the second yellow-green light emitting layer contacting the first yellow-green light emitting layer. In this case, the proportion of the dopant of the first yellow-green light emitting layer may be set within a range of 10 to 50 wt % and the proportion of the dopant of the second yellow-green light emitting layer may be set within a range of 5 to 30 wt %.

When the red light emitting layer includes the hole transport host, a proportion of the hole transport host of the red light emitting layer is within a range of 10 to 50 wt %.

When the first yellow-green light emitting layer includes the hole transport host, a proportion of the hole transport host of the first yellow-green light emitting layer is 15 to 55 wt %.

When the second yellow-green light emitting layer include the hole transport host, a proportion of the hole transport host of the second yellow-green light emitting layer is 40 to 80 wt %.

Meanwhile, the white organic light emitting diode may further include a green light emitting layer on the yellow-green light emitting layer. In this case, at least one layer of the red light emitting layer, the yellow-green light emitting layer and the green light emitting layer may include the hole transport host.

When the yellow-green light emitting layer includes the hole transport host, a proportion of the hole transport host of the yellow-green light emitting layer is set within a range of 15 to 55 wt % and, when the green light emitting layer includes the hole transport host, a proportion of the hole transport host of the green light emitting layer is set within a range of 40 to 80 wt %.

Regarding the structure including the yellow-green light emitting layer and the green light emitting layer, a proportion of a yellow-green dopant of the yellow-green light emitting layer is higher than a proportion of a green dopant of the green light emitting layer. The proportion of the yellow-green dopant is set within a range of 10 to 50 wt %, and the proportion of the green dopant is set within a range of 5 to 30 wt %.

Meanwhile, the white organic light emitting diode may further include a second charge generation layer and a third light emitting layer between the second light emitting layer and the second electrode, wherein the third light emitting part includes a second blue light emitting layer.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings. Wherever possible, the same reference numbers will be used throughout the drawings to refer to the same or like parts. In the following description, detailed descriptions of technologies or configurations related to the present disclosure may be omitted so as to not unnecessarily obscure the subject matter of the present disclosure. In addition, terms of components used in the following description are selected in consideration of ease of specification writing and may be different from those of components of actual products.

It will be understood that when an element or layer is referred to as being "on" another element or layer, it can be directly on the other element or at least one intervening element may also be present therebetween. In contrast, when an element or layer is referred to as "contacting" another element or layer, there is no intervening element or layer present therebetween.

Figure 1A:
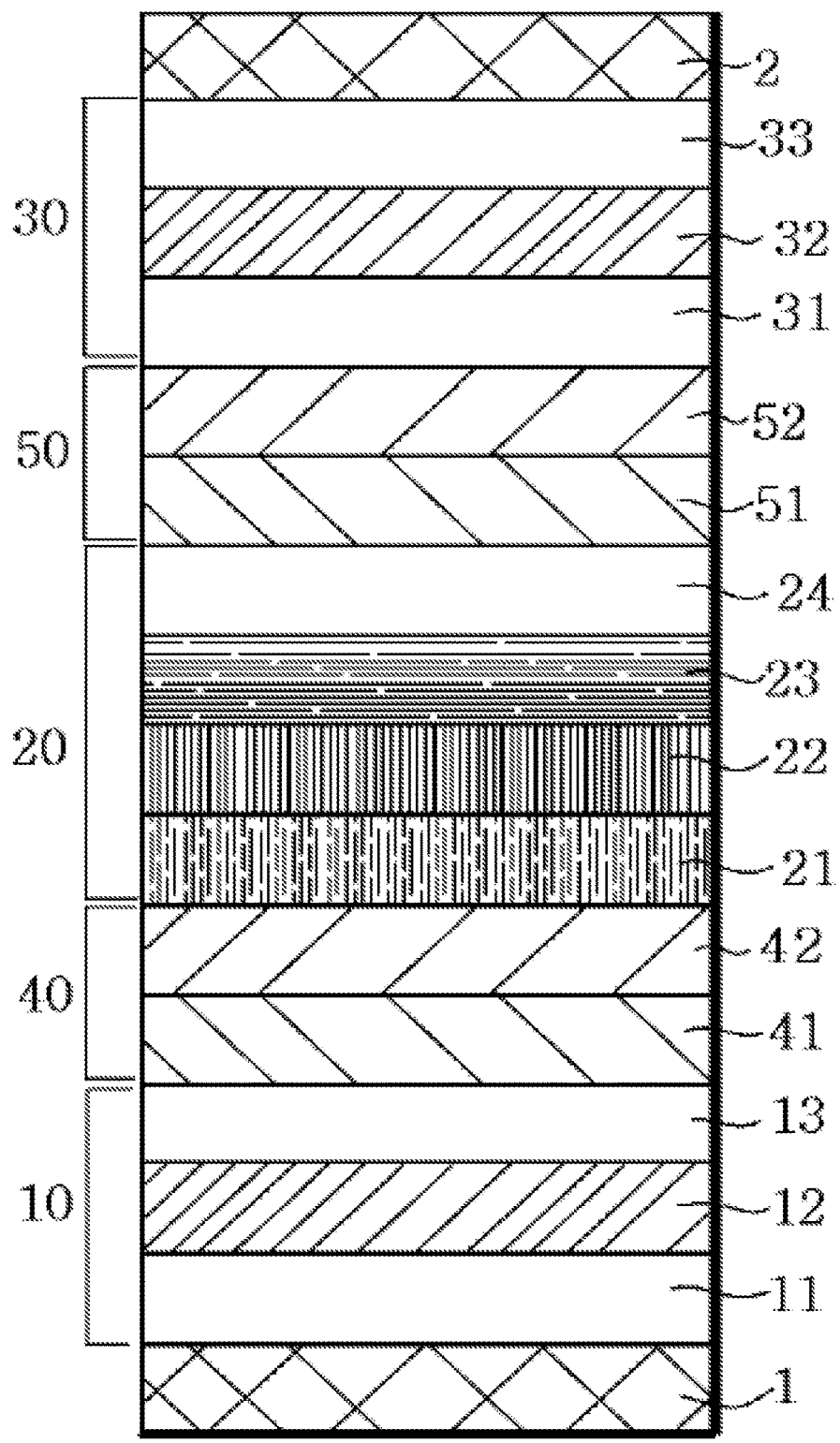
FIGS. 1A and 1B are schematic views illustrating a white organic light emitting diode according to the present disclosure.
Figure 1B:
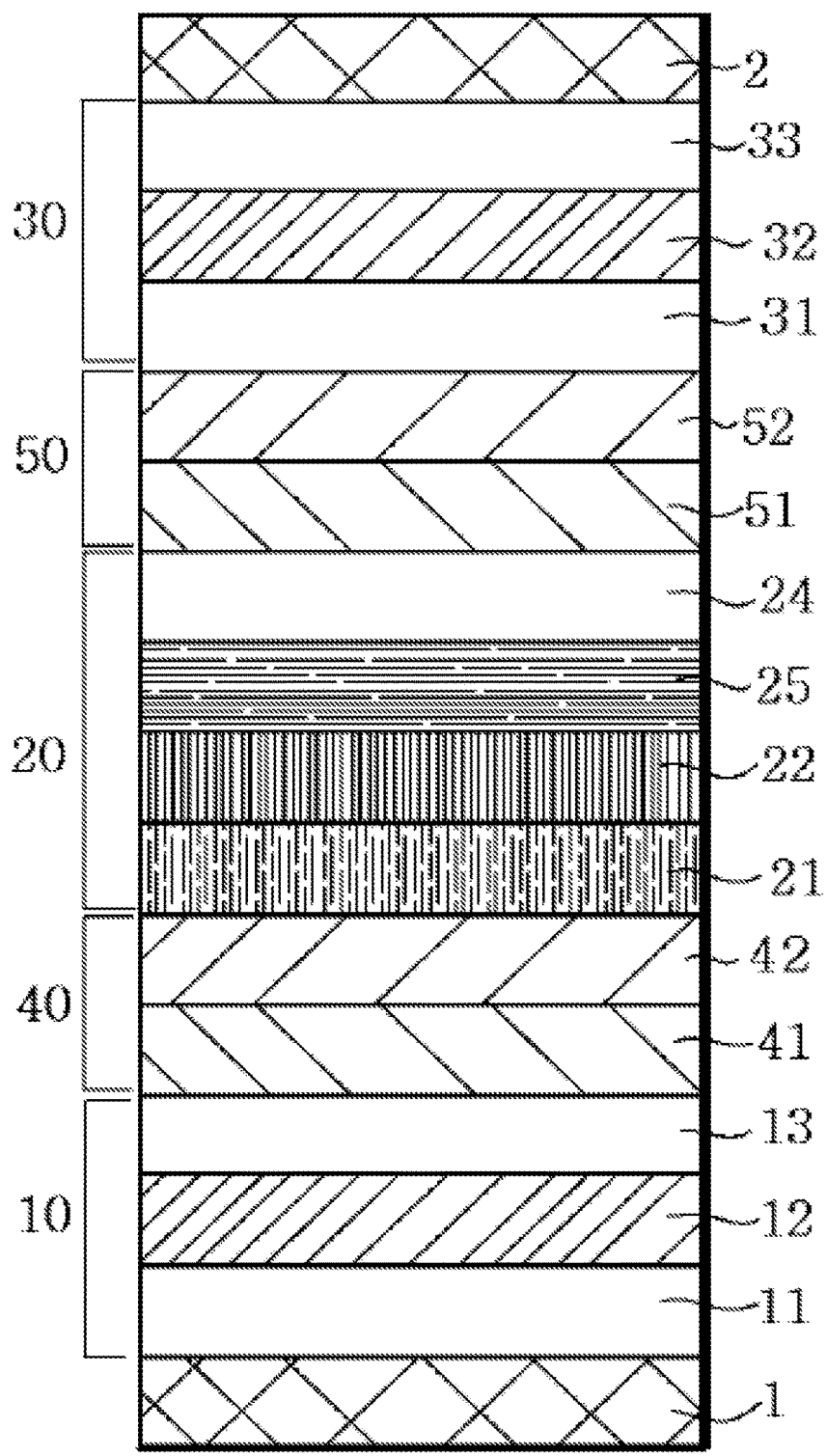

FIGS. 1A and 1B are schematic views illustrating a white organic light emitting diode according to the present disclosure.

As shown in FIG. 1A, the white organic light emitting diode according to the present disclosure includes a first light emitting part 10 which is disposed on a first electrode 1 and includes a first blue light emitting layer 13, a first charge generation layer 40 disposed on the first light emitting part 10, a second light emitting part 20 disposed on the first charge generation layer 40, a second charge generation layer 50 disposed on the second light emitting part 20, a third light emitting part 30 which is disposed on the second charge generation layer 50 and includes a second blue light emitting layer 32, and a second electrode 2 disposed on the third light emitting part 30.

The first electrode 1 is an anode which may be made of a transparent conductive material having a high work function such as indium tin oxide (ITO), indium zinc oxide (IZO), and zinc oxide (ZnO).

The first charge generation layer 40 includes a first n-type charge generation layer 41 and a first p-type charge generation layer 42. The first charge generation layer 40 may have a stacked structure in which the first p-type charge generation layer 42 is disposed on the first n-type charge generation layer 41, but the present disclosure is necessarily not limited thereto. The first n-type charge generation layer 41 functions to inject electrons into the first light emitting part 10 adjacent thereto and the first p-type charge generation layer 42 functions to inject holes into the second light emitting part 20 adjacent thereto.

The second charge generation layer 50 includes a second n-type charge generation layer 51 and a second p-type charge generation layer 52. The second charge generation layer 50 may have the same structure as the first charge generation layer 40, but the present disclosure is necessarily not limited thereto. The second n-type charge generation layer 51 functions to inject electrons into the second light emitting part 20, whereas the second p-type charge generation layer 52 functions to inject holes into the third light emitting part 30.

The charge generation layers 40 and 50 may be formed using a variety of organic materials having electron donor and acceptor properties.

For example, the p-type charge generation layers 42 and 52 may include hexaazatriphenylene-hexacarbonitrile (HAT-CN)(dipyrazino [2,3-f:2',3'-h]quinoxaline=2,3,6,7,10, 11-hexacarbonitrile) or have a p-doping structure. In addition, the charge generation layers 40 and 50 may be a single layer such as the HAT-CN.

The first charge generation layer 40 controls charge balance between the first light emitting part 10 and the second light emitting part 20 and the second charge generation layer 50 controls charge balance between the second light emitting part 20 and the third light emitting part 30.

The first light emitting part 10 includes a first hole transport layer 11, a first blue light emitting layer 12 disposed on the first hole transport layer 11, and a first electron transport layer 13 disposed on the first blue light emitting layer 12. The first hole transport layer 11, the first blue light emitting layer 12 and the electron transport layer 13 may be stacked sequentially, but the present disclosure is necessarily not limited thereto. For example, the first hole transport layer 11 and the first electron transport layer 13 may be a single layer or multiple layers.

The first hole transport layer 11 may be composed of multiple layers. In this case, preferably, a lower layer of the first hole transport layer 11, that is, a layer close to the first electrode 1 is formed using a material having a higher mobility, and an upper layer of the first hole transport layer 11, that is, a layer close to the first blue light emitting layer 12 is formed using a material having a higher triplet energy level (T1). The first hole transport layer 11 functions to smoothly supply holes from the anode 1 to the first blue light emitting layer 12.

The first electron transport layer 13 disposed on the first blue light emitting layer 12 functions to smoothly transfer electrons from the first n-type charge generation layer 41 of the first charge generation layer 40 to the first blue light emitting layer 12.

The third light emitting part 30 includes a third hole transport layer 31, a second blue light emitting layer 32 disposed on the third hole transport layer 31, and a third electron transport layer 33 disposed on the second blue light emitting layer 32. The third hole transport layer 31, the second blue light emitting layer 32 and the third electron transport layer 33 may be stacked sequentially, but the present disclosure is not necessarily limited thereto.

The first hole transport layer 11 functions to smoothly supply holes from the anode 1 to the first blue light emitting layer 12, and the third electron transport layer 33 on the second blue light emitting layer 32 functions to smoothly supply charges from the cathode 2 to the second blue light emitting layer 32.

The first and second blue light emitting layers 12 and 32 are light emitting layers which include a blue dopant and host, and emit blue light. At this time, the first and second blue light emitting layers 12 and 32 may be a deep blue light emitting layer or a sky-blue light emitting layer. Each peak wavelength of the blue light emitting layers is determined within a range of about 440 nm to about 480 nm. The first and second blue light emitting layers 12 and 32 may emit fluorescent light or phosphorescent light, and include at least one host, as a mixed host, and at least one dopant. Specifically, the first and second blue light emitting layers 12 and 32 may include at least one host material, which is doped with a blue dopant, selected from the group consisting of anthracene, pyrene and perylene derivatives, but the present disclosure is not necessarily limited thereto.

The second light emitting part 20 includes a red light emitting layer 21 and a yellow-green light emitting layer. The yellow-green light emitting layer may have a monolayer or multilayer structure, and, in particular, has a stacked structure in which a first yellow-green light emitting layer 22 and a second yellow-green light emitting layer 23 are stacked sequentially so as to contact each other.

A second electron transport layer 24 may be further disposed on the second yellow-green light emitting layer 23. The second electron transport layer 24 may be formed so as to contact the second yellow-green light emitting layer 23 and the second charge generation layer 50, but the present disclosure is not necessarily limited thereto. The second electron transport layer 24 functions to transfer electrons from the second n-type charge generation layer 51 of the second charge generation layer 50 to each light emitting layer of the second light emitting part 20.

At least one layer of the red light emitting layer 21, the first yellow-green light emitting layer 22 and the second yellow-green light emitting layer 23 is based on the material shown in Formula 1 and includes a hole transport host having a hole transport property.

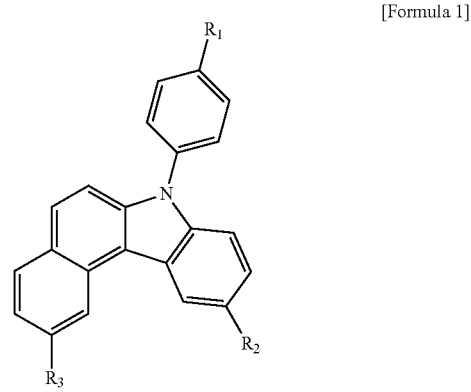

[Formula 1]

wherein each $R_1$, $R_2$ $R_3$ are each independently selected from the group consisting of hydrogen, heavy hydrogen (i.e., isotopes of hydrogen such as deuterium and tritium), a C5-C7 aromatic cyclic and C1-C6 heterocyclic group, but the present disclosure is not necessarily limited thereto.

The term "at least one layer" as used herein means that only one of the red light emitting layer 21, the first yellow-green light emitting layer 22 and the second yellow-green light emitting layer 23 may include the hole transport host based on the material of Formula 1, and two or all layers may include the hole transport host based on the material of Formula 1.

The red light emitting layer 21 may be a single host material based on a material selected from the group consisting of α-NPD, TCTA, TPD, TPB, TAC, m-TPEE, FTPD, (NDA)PP, TRP, PPD, and OPT1, or a mixed host of a plurality of host materials co-deposited, but the present disclosure is not necessarily limited thereto.

Meanwhile, the red light emitting layer 21 may include a mixed host of the hole transport host based on the material of Formula 1 and another host which are co-deposited. In this case, "another host" may be a host material based on the material selected from the group described above, but the present disclosure is necessarily not limited thereto. The case where the white organic light emitting diode includes a red light emitting layer 21 has the same effects of improving efficacy and color quality as the case where the white organic light emitting diode passes through the red color filter, which then renders red.

In the case where the red light emitting layer 21 includes a hole transport host based on the material of Formula 1, when the proportion of the hole transport host based on the material of Formula 1 of the red light emitting layer 21 is within the range of 10 to 50 wt %, the effect of increasing lifespan of the red light emitting layer 21 is maximized.

The red light emitting layer 21 may emit fluorescent or phosphorescent light.

The phosphorescent dopant material that can be used as a dopant of the red light emitting layer 21 may include a metal compound which forms tri-coordinate of N—N, N—O and O—O, based on an iridium (Ir) metal in the center. Specifically, the phosphorescent dopant may include Ir(Piq)$_3$(Tris (1-phenylisoquinoline)iridium (III)), Ir(piq)$_2$(acac)(Bis(1-phenylisoquinoline)(acetylacetonate)iridium(III)), Ir(btp)$_2$ (acac)(Bis)2-benzo[b]thiophen-2-yl-pyridine) (acetylacetonate)iridium(III)), Ir(BT)$_2$(acac)(Bis(2-phenylbenzothazolato)(acetylacetonate)iridium(III)), or the like, but the present disclosure is not necessarily limited thereto.

The fluorescent dopant that can be used as a dopant of the red light emitting layer 21 may include rubrene (5,6,11,12-tetraphenylnaphthacene), DCJTB (4-(dicyanomethylene)-2-tert-butyl-6-(1,1,7,7-tetramethyljuloidin-4-yl-vinyl)-4H pyran) or the like, but the present disclosure is not necessarily limited thereto.

The first yellow-green light emitting layer 22 and the second yellow-green light emitting layer 23 may include a single host or a mixed host of co-deposited at least one host, and at least one dopant. Specifically, the first and second yellow-green light emitting layers 22 and 23 may include a phosphorescent host material including a carbazole-based compound or metal complex, which is doped with a phosphorescent yellow-green dopant. The carbazole-based compound may include CBP(4,4'-bis(carbazol-9-yl)-biphenyl), a CBP derivative, mCP (N,N'-dicarbazolyl-3,5-benzene) or a mCP derivative or the like, and the metal complex may include a ZnPBO (phenyloxazole), or ZnPBT (phenylthiazole) metal complex or the like.

In the case of a double-layer stacked structure, a doping ratio of the dopant of the first yellow-green light emitting layer 22 is higher than a doping ratio of the dopant of the second yellow-green light emitting layer 23. More specifically, preferably, the doping ratio of the dopant of the first yellow-green light emitting layer 22 is within the range of 10 to 50 wt % and the doping ratio of the second yellow-green light emitting layer 23 is within the range of 3 to 35 wt %.

The dopant of the yellow-green light emitting layer functions to trap electrons supplied from the second electron transport layer 24. As a result, when the yellow-green light emitting layer is formed as a single layer and has the same dopant proportion, the amount of electrons trapped in the yellow-green light emitting layer increases and the electrons do not stably reach the red light emitting layer 21, thus causing problems such as reduction in the total luminous efficacy of the organic light emitting diode and increased driving voltage.

On the other hand, when dopant proportions of the first and second yellow-green light emitting layers 22 and 23 are controlled to be different, the amount of electrons trapped in the second yellow-green light emitting layer 23 having a relatively low dopant proportion is reduced and the first yellow-green light emitting layer 22 has a relatively high dopant proportion, so that the luminous efficacy of the yellow-green light emitting layer can be maintained and electrons can be stably transferred from the second electron transport layer 24 to the red light emitting layer 21. As a result, by controlling the dopant proportions of the first and second yellow-green light emitting layers 22 and 23 to be different, luminous efficacy can be improved and a driving voltage can be reduced.

As described above, the first yellow-green light emitting layer 22 and the second yellow-green light emitting layer 23 may include the hole transport host based on the material of Formula 1. In this case, the first yellow-green light emitting layer 22 and the second yellow-green light emitting layer 23 may have a co-deposition structure of the hole transport host based on the material of Formula 1 and the phosphorescent host material including a carbazole-based compound or metal complex.

In the case where the first yellow-green light emitting layer 22 includes the hole transport host based on the material of Formula 1, when the proportion of the host is set within the range of 15 to 55 wt %, the effect of improving lifespan of the first yellow light emitting layer 22 is maximized. In addition, in the case where the second yellow-green light emitting layer 23 includes the hole transport host based on the material of Formula 1, when the proportion thereof ranges from 40 to 80 wt %, the effect of improving lifespan of the second yellow-green light emitting layers 22 and 23 is maximized.

With regard to the red light emitting layer 21, the first yellow-green light emitting layer 22 and the second yellow-green light emitting layer 23, the proportions of the respective light emitting layers are different in order to maximize lifespan, as described above. The reason for this is as follows.

First, since the red light emitting layer 21 is relatively close to the first p-type charge generation layer 42 of the first charge generation layer 40, although the proportion of the hole transport host is not very high, a sufficient amount of holes is injected, whereas, when the proportion of the hole transport host of the red light emitting layer 21 is excessively high, injection of electrons supplied from the second n-type charge generation layer 52 of the second charge generation layer 50 or the second electrode 2 can be inhibited. In this case, disadvantageously, luminous properties and lifespan are deteriorated. On the other hand, the second yellow-green light emitting layer 23 is relatively close to the second n-type charge generation layer 51 and is relatively far from the first p-type charge generation layer 42. As a result, the second yellow-green light emitting layer 23 facilitates injection of electrons, but a characteristic of hole transportation needs to be improved. Thus, by increasing the proportion of the hole transport host, the effect of increasing lifespan can be improved.

Since the first yellow-green light emitting layer 22 is disposed between the red light emitting layer 21 and the second yellow-green light emitting layer 23, when it includes an intermediate proportion of the hole transport host, the effect of increasing lifespan can be maximized.

Meanwhile, as shown in FIG. 1B, the second yellow-green light emitting layer 24 can be replaced with a green light emitting layer 25. In this case, the green light emitting layer 25, like the first and second yellow-green light emitting layers 22 and 23, may include a mixed host of at least one host co-deposited and at least one dopant. Specifically, the green light emitting layer 25 may include a phosphorescent host material including a carbazole-based compound or metal complex which is doped with a green phosphorescent dopant. The carbazole-based compound may include CBP (4,4'-bis(carbazol-9-yl)-biphenyl), a CBP derivative, mCP (N,N'-dicarbazolyl-3,5-benzene) or a mCP derivative or the like, and the metal complex may include a ZnPBO (phenyloxazole) or ZnPBT (phenylthiazole) metal complex or the like, but the present disclosure is not necessarily limited thereto.

The green phosphorescent dopant may be Ir(PPy)$_2$(acac), Ir(PPy)$_3$, GD48 commercially available from UDC corporation or the like, but the present disclosure is not necessarily limited thereto. The phosphorescent dopant of the green light emitting layer 25 can function to trap electrons as well and the proportion of the green dopant of the green light emitting layer 25 is preferably lower than the proportion of the yellow-green dopant of the first yellow-green light emitting layer 22. In this case, as well, preferably, the doping proportion of the dopant in the first yellow-green light emitting layer 22 is within the range of 10 to 50 wt % and the doping proportion of the dopant in the green light emitting layer 25 is within the range of 3 to 35 wt %.

Similarly, the green light emitting layer 25 may include a hole transport host based on the material of Formula 1. In this case, the green light emitting layer 25 may have a structure in which the hole transport host based on the material of Formula 1 is co-deposited with the phosphorescent host material including a carbazole-based compound or metal complex.

In the case where the green light emitting layer 25 includes the hole transport host based on the material of Formula 1, when the proportion thereof is within the range of 40 to 80 wt %, an effect of maximizing the lifespan thereof can be obtained.

As such, the white organic light emitting diode having a tandem structure in which the green light emitting layer 25 is provided on the first yellow-green light emitting layer 22 has the same effects of improving efficacy and color quality as the case where the white organic light emitting diode passes through the green color filter, which then renders green.

A second hole transport layer (not shown) may be further disposed between the red light emitting layer 21 and the first charge generation layer 40. The second hole transport layer functions to supply holes generated in the first p-type charge generation layer 42 of the first charge generation layer 40 to the red light emitting layer 21 and may not be provided with a second hole transport layer (not shown) according to design. At this time, the red light emitting layer 21 may function as the second hole transport layer as well.

In the present embodiment, the white organic light emitting diode provided with the first light emitting part 10, the second light emitting part 20 and the third light emitting part 30 has been described, but the third light emitting part 30 and the second charge generation layer 50 may be omitted according to design. In this case, the white organic light emitting diode according to the present disclosure may include an anode 1, a first light emitting part 10, a first charge generation layer 40, a second light emitting part 20 and a cathode 2 which are stacked in this order.

Figure 2:
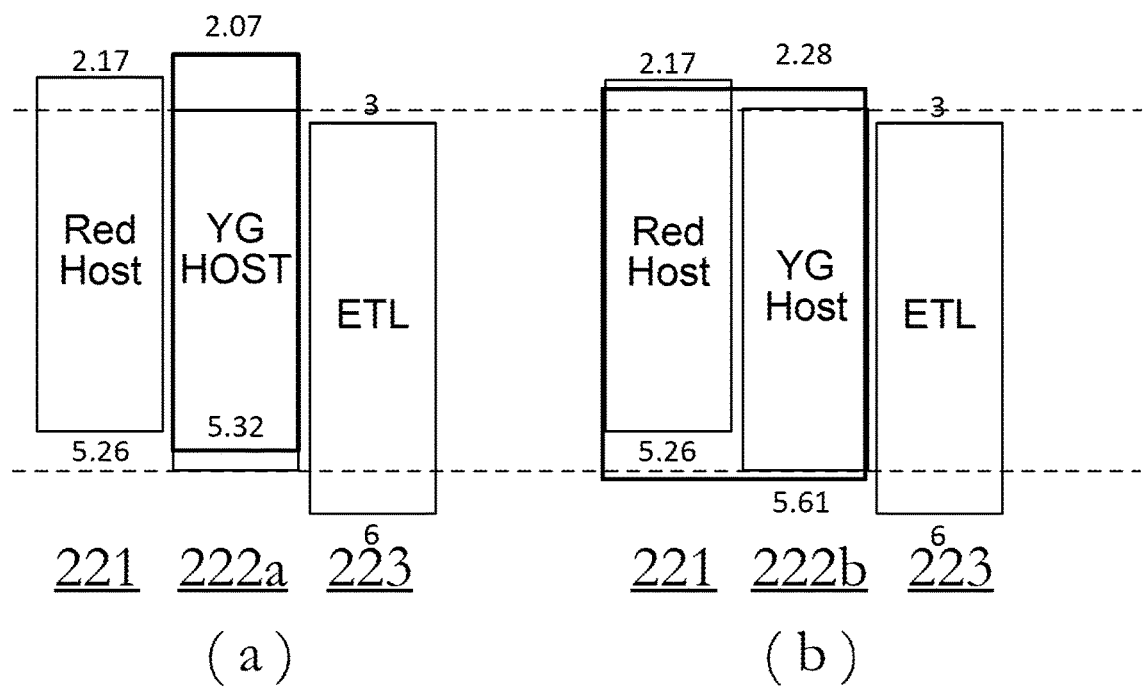
FIG. 2 shows an example for illustrating effects of improving lifespan and efficacy of the white organic light emitting diode according to the present disclosure.

FIG. 2 shows an example for illustrating effects of improving lifespan and efficacy of the white organic light emitting diode according to the present disclosure. FIG. 2A shows HOMO and LUMO energy levels of each host in a red light emitting layer, a green light emitting layer and an electron transport layer which each include a conventional representative host material.

FIG. 2B shows HOMO and LUMO energy levels of each host in the red light emitting layer 221, the yellow-green light emitting layer 222b and the electron transport layer 223 regarding the present disclosure using the conventional host material for the red light emitting layer and the electron transport layer, and using the hole transport host based on the material of Formula 1 for the yellow-green light emitting layer.

In FIG. 2A, the HOMO energy level and the LUMO energy level of the host of the red light emitting layer 221 is −5.26 eV and −2.17 eV, respectively, the HOMO energy level and the LUMO energy level of the host of the yellow-green light emitting layer 222a are −5.32 eV and −2.07 eV, respectively, and the HOMO energy level and the LUMO energy level of the host of the electron transport layer 223 are −6 eV and −3 eV, respectively.

Meanwhile, the HOMO and LUMO energy levels of the hosts of the red light emitting layer 221 and the electron transport layer 223 of FIG. 2B are the same as those of FIG. 2A. The HOMO and LUMO energy levels of the host of the yellow-green light emitting layer 222b are −5.61 eV and −2.28 eV, respectively, which are lower HOMO energy level and higher LUMO energy level than the yellow-green light emitting layer 222 shown in FIG. 2A.

Accordingly, the HOMO energy level of the yellow-green light emitting layer 222 is much lower than the HOMO energy level of the red light emitting layer adjacent thereto. As a result, the characteristic of hole transportation from the red light emitting layer 21 to the yellow-green light emitting layer 222b is greatly improved.

In addition, in FIG. 2A, the LUMO energy level of the host of the yellow-green light emitting layer 222a is higher than the LUMO energy level of the host of the electron transport layer 223 and the LUMO energy level of the host of the red light emitting layer 221. On the other hand, in FIG. 2B, the LUMO energy level of the host of the yellow-green light emitting layer 222b is higher than the LUMO energy level of the host of the electron transport layer 223 adjacent thereto and is lower than the LUMO energy level of the host of the red light emitting layer 221. As a result, a characteristic of electron transportation from the electron transport layer 223 through the yellow-green light emitting layer 222b to the red light emitting layer 221 can be greatly improved.

In order words, the white organic light emitting diode using the hole transport host based on the compound 1 according to the present disclosure can improve both characteristics of hole transportation and electron transportation, thus leading to effects of improving luminous efficacy and lifespan of the element due to increase in recombination regions of electron-hole pairs in the light emitting layer.

Figure 3:
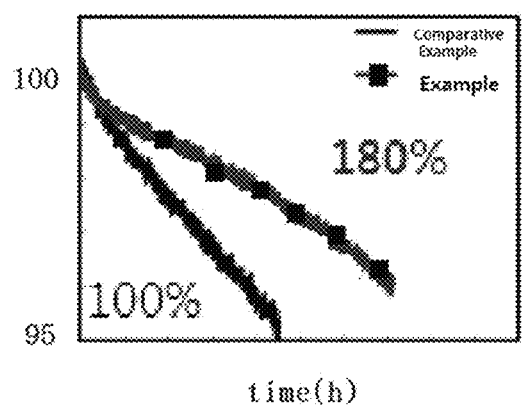
FIGS. 3 and 4 are graphs illustrating the effect of improving the lifespan of the organic light emitting diode according to the present disclosure.
Figure 3:
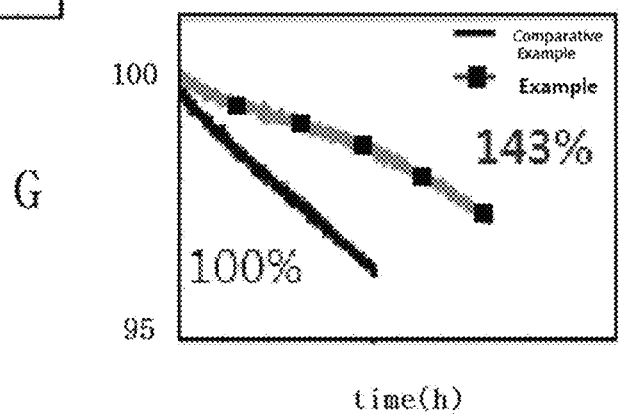
Figure 4:
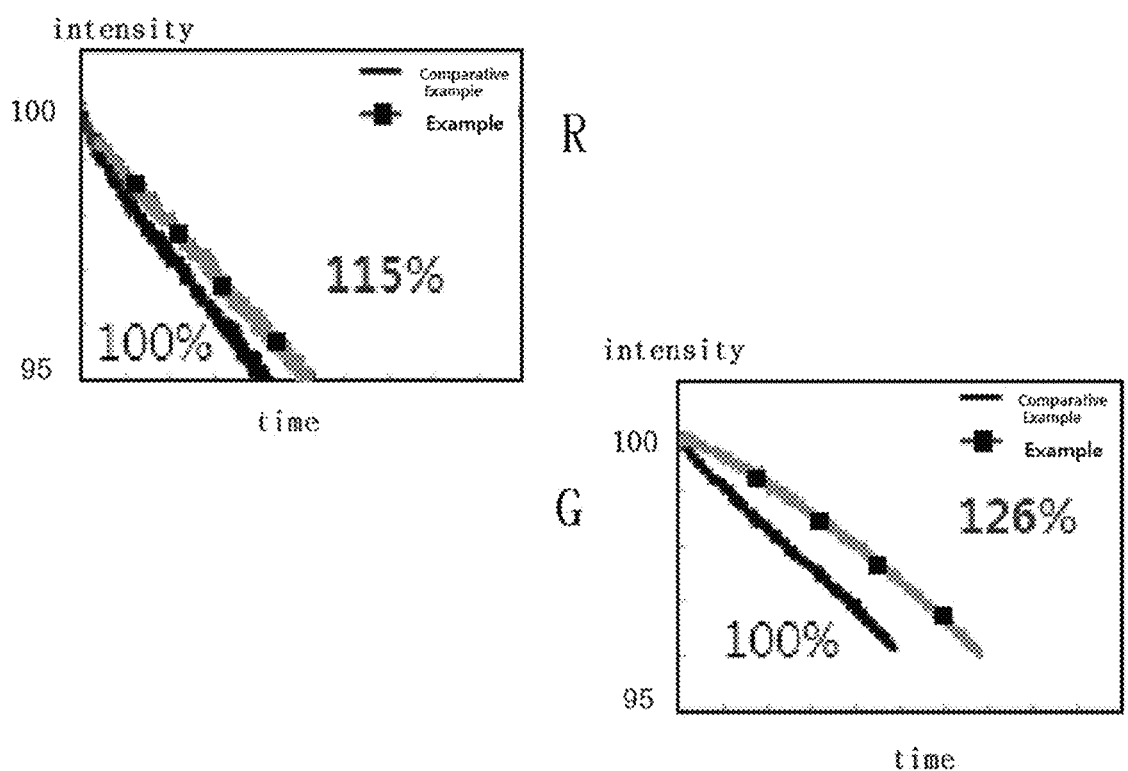

FIGS. 3 and 4 are graphs illustrating the effect of improving the lifespan of the organic light emitting diode according to the present disclosure. FIG. 3 is a graph showing the effect of lifespan improvement regarding a white organic light emitting diode provided with a second light emitting part 20 including a red light emitting layer, a first yellow-green light emitting layer and a second yellow-green light emitting layer stacked in this order. In addition, FIG. 4 is a graph showing the effect of lifespan improvement regarding a white organic light emitting diode provided with a second light emitting part 20 including a red light emitting layer, a yellow-green light emitting layer and a green light emitting layer stacked in this order.

In FIGS. 3 and 4, the white organic light emitting diode according to Comparative Example relates to the prior art, whereas the white organic light emitting diode according to Example includes a red light emitting layer, a yellow-green light emitting layer and a green light emitting layer which include a hole transport host based on the material of Formula 1.

The white organic light emitting diode of FIG. 3 exhibited an about 80% increase in red brightness lifespan and an about 43% increase in green brightness lifespan, compared to the prior art.

The white organic light emitting diode of FIG. 4 exhibited an about 15% increase in red brightness lifespan and an about 26% increase in green brightness lifespan, compared to the prior art.

The white organic light emitting diode using the hole transport host based on the material of Formula 1 according to the present disclosure has an effect of greatly improving red and green brightness lifespan, as compared to the prior art.

Figure 5:
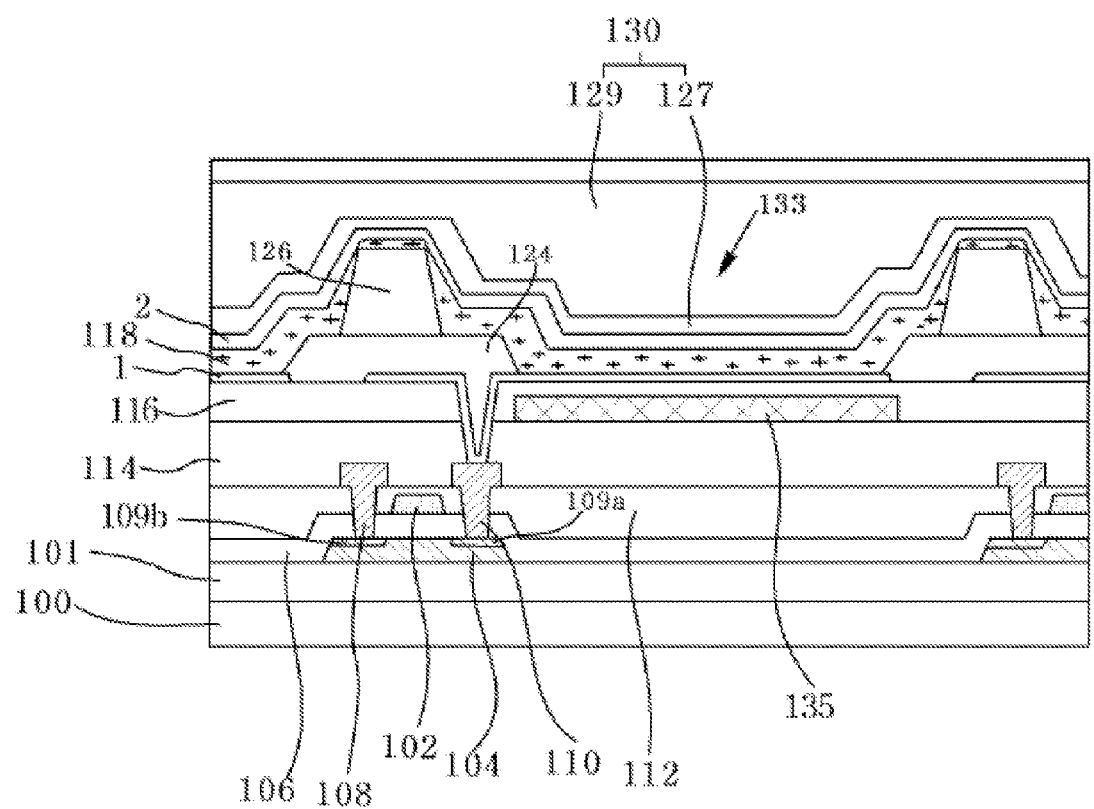
FIG. 5 is a sectional view illustrating a schematic configuration of each pixel provided in a display panel according to the present disclosure.

FIG. 5 is a sectional view illustrating a schematic configuration of each pixel provided in a display panel according to the present disclosure.

As shown in FIG. 5, a driving transistor (TR2) includes a semiconductor layer 104 which is formed on a substrate 100 and a buffer layer 101, and includes a source region 109a and a drain region 109b at both sides thereof, a gate insulating film 106 which covers the semiconductor layer 104, a gate electrode 102 which is disposed on the gate insulating film 106 corresponding to the semiconductor layer 104, a first protective layer 112 which covers the substrate 100 including the gate electrode 102 and includes contact holes 113 which exposes source/drain regions 109a and 109b disposed at both sides of the semiconductor layer 104, and a source electrode 110 and a drain electrode 108 which contact the source/drain regions 109a and 109b through the contact holes.

A second protective layer 114 and a third protective layer 116 are disposed on the driving transistor (TR2). The organic light emitting diode according to the present disclosure is disposed on the third protective layer 116. The organic light emitting diode include a first electrode 1, a bank insulation film 124 provided with an opening 133 to expose the first electrode 1, a spacer 126 disposed on the bank insulation film 124, an organic layer 118 including a light emitting layer formed on the first electrode 1 exposed through the opening 133, and a second electrode 2 formed on the organic layer 118.

In this case, the first protective film 112 includes a contact hole exposing the drain electrode 108, and the first electrode 1 is connected to the drain electrode 108 of a thin film transistor through the contact hole.

In this case, the substrate 100 is a flexible glass or polymer substrate and the light emitting display panel according to the present disclosure can be produced as a flexible or foldable display. In this case, the light emitting display panel according to the present disclosure includes at least one folding area in the display area and the entire display area is flexible.

The organic layer 118 includes the organic light emitting diode according to the present disclosure. The organic layer 118 utilizes the configuration of the aforementioned white organic light emitting diode according to the present disclosure. That is, the first light emitting part 10, the first charge generation layer 40 and the second light emitting part 20 according to the present disclosure may be stacked in this order between the first electrode 1 and the second electrode 2, or the first light emitting part 10, the first charge generation layer 40, the second light emitting part 20, the second charge generation layer 50 and the third light emitting part 30 may be stacked in this order therebetween.

A barrier layer 130 is disposed on the second electrode 2. The barrier layer 130 has a structure in which at least one inorganic film 127 and at least one organic film 129 are alternately stacked.

The organic light emitting display utilizing the white organic light emitting diode according to the second embodiment includes a color filter 135 disposed in a region corresponding to the opening 113 on the second protective layer 114. The color filter 135 converts white light emitted from the white organic light emitting diode into red, green and blue light.

The organic light emitting display utilizing the white organic light emitting diode and the color filter 135 is formed by depositing the first to third light emitting parts 30, 50 and 70 for emitting white light in the entire pixels, rather than independently depositing red, green, blue organic light emitting diodes on respective pixels. Accordingly, regarding the organic light emitting display utilizing the white organic light emitting diode, it is possible to form the organic layer 118 without any mask and provide effects of increased size, improved lifespan and reduced power consumption.

As apparent from the foregoing, the white organic light emitting diode utilizing the hole transport host according to the present disclosure can improve hole transport by considerably reducing a HOMO energy level of at least one layer of the red light emitting layer, the yellow-green light emitting layer and the green light emitting layer, and can enhance electron transport from the electron transport layer to each light emitting layer of the second light emitting part by increasing the LUMO energy level thereof.

As a result, the white organic light emitting diode utilizing the hole transport host according to the present disclosure can improve both characteristics of hole transportation and electron transportation, thus leading to effects of improving luminous efficacy and lifespan of the element due to increase in recombination regions of electron-hole pairs in the light emitting layer.

Meanwhile, according to the present disclosure, when the yellow-green light emitting layer is divided into first and second yellow-green light emitting layers, and the first and second yellow-green light emitting layers are controlled to have different dopant proportions, the amount of electrons trapped in the second yellow-green light emitting layer having a relatively low dopant proportion is reduced, and the first yellow-green light emitting layer has a relatively high dopant proportion so that luminous efficacy of the yellow-green light emitting layer can be maintained and electrons can be stably transferred from the second electron transport layer to the red light emitting layer. As a result, by controlling the dopant proportions of the first and second yellow-green light emitting layer to be different, luminous efficacy can be improved and driving voltage can be reduced.

The white organic light emitting diode according to the present disclosure may be provided with the green light emitting layer, instead of the second yellow-green light emitting layer. In this case, although the hole transport host is applied to the green light emitting layer and the dopant proportion of the green light emitting layer is set to be lower than that of the yellow-green light emitting layer, the same effects as mentioned above can be obtained.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A white organic light emitting diode, comprising:
a first light emitting part disposed on a first electrode and including a first blue light emitting layer;
a first charge generation layer disposed on the first light emitting part;
a second light emitting part disposed on the first charge generation layer; and
a second electrode disposed on the second light emitting part, wherein the second light emitting part comprises:
a red light emitting layer disposed on the first charge generation layer; and
a yellow-green light emitting layer disposed on the red light emitting layer,
wherein at least one layer of the red light emitting layer and the yellow-green light emitting layer comprises a hole transport host based on a compound shown below:

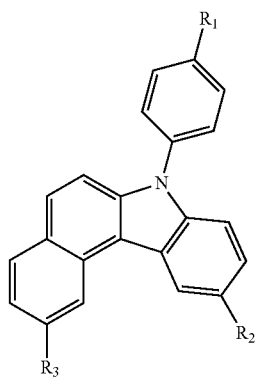

wherein each of $R_1$, $R_2$, and $R_3$ are independently selected from the group consisting of hydrogen, heavy hydrogen, a C5-C7 aromatic cyclic and C1-C6 heterocyclic group.

2. The white organic light emitting diode according to claim 1, wherein the yellow-green light emitting layer comprises:
a first yellow-green light emitting layer contacting the red light emitting layer; and
a second yellow-green light emitting layer contacting the first yellow-green light emitting layer.

3. The white organic light emitting diode according to claim 2, wherein a proportion of the dopant of the first yellow-green light emitting layer is higher than that of the second yellow-green light emitting layer.

4. The white organic light emitting diode according to claim 3, wherein the proportion of the dopant of the first yellow-green light emitting layer is set within a range of 10 to 50 wt % and the proportion of the dopant of the second yellow-green light emitting layer is set within a range of 5 to 30 wt %.

5. The white organic light emitting diode according to claim 1, wherein the red light emitting layer comprises the hole transport host, and
wherein a proportion of the hole transport host of the red light emitting layer is within a range of 10 to 50 wt %.

6. The white organic light emitting diode according to claim 2, wherein the first yellow-green light emitting layer comprises the hole transport host, and
wherein a proportion of the hole transport host of the first yellow-green light emitting layer is 15 to 55 wt %.

7. The white organic light emitting diode according to claim 2, wherein the second yellow-green light emitting layer comprises the hole transport host, and
wherein a proportion of the hole transport host of the second yellow-green light emitting layer is 40 to 80 wt %.

8. The white organic light emitting diode according to claim 1, further comprising:
a second charge generation layer disposed on the yellow-green light emitting layer; and
a third light emitting part disposed between the second charge generation layer and the second electrode, and comprising a second blue light emitting layer.

9. A white organic light emitting diode comprising:
a first light emitting part disposed on a first electrode and comprising a first blue light emitting layer;
a first charge generation layer disposed on the first light emitting part;
a second light emitting part disposed on the first charge generation layer; and
a second electrode disposed on the second light emitting part, wherein the second light emitting part comprises:
a red light emitting layer disposed on the first charge generation layer;
a yellow-green light emitting layer disposed on the red light emitting layer; and
a green light emitting layer disposed on the yellow-green light emitting layer,
wherein at least one layer of the red light emitting layer, the yellow-green light emitting layer and the green light emitting layer comprises a hole transport host based on a compound shown below:

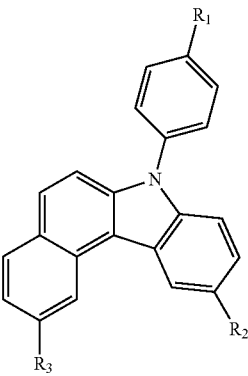

wherein each of $R_1$, $R_2$, and $R_3$ are independently selected from the group consisting of hydrogen, heavy hydrogen, a C5-C7 aromatic cyclic and C1-C6 heterocyclic group.

10. The white organic light emitting diode according to claim 9, wherein the red light emitting layer comprises the hole transport host, and
wherein a proportion of the hole transport host of the red light emitting layer is 10 to 50 wt %.

11. The white organic light emitting diode according to claim 9, wherein the yellow-green light emitting layer comprises the hole transport host, and
wherein a proportion of the hole transport host of the yellow-green light emitting layer is 15 to 55 wt %.

12. The white organic light emitting diode according to claim 9, wherein the green light emitting layer comprises the hole transport host, and wherein a proportion of the hole transport host of the green light emitting layer is 40 to 80 wt %.

13. The white organic light emitting diode according to claim 9, wherein a proportion of a yellow-green dopant of the yellow-green light emitting layer is higher than a proportion of a green dopant of the green light emitting layer.

14. The white organic light emitting diode according to claim 13, wherein the proportion of the yellow-green dopant of the yellow-green light emitting layer is set within a range of 10 to 50 wt %, and the proportion of the green dopant of the green light emitting layer is set within a range of 5 to 30 wt %.

15. The white organic light emitting diode according to claim 9, further comprising:

a second charge generation layer disposed on the green light emitting layer; and a third light emitting part disposed between the second charge generation layer and the second electrode, and comprising a second blue light emitting layer.

16. An organic light emitting display comprising:

a thin film transistor disposed on a substrate;

a first protective layer covering the thin film transistor;

a color filter layer disposed on the first protective layer;

a second protective layer disposed on the color filter layer;

a contact hole exposing a drain electrode of the thin film transistor; and the white organic light emitting diode according to claim 1 disposed on the second protective layer and connected to the drain electrode of the thin film transistor through the contact hole.

* * * * *